(12) United States Patent
Young et al.

(10) Patent No.: US 6,436,851 B1
(45) Date of Patent: Aug. 20, 2002

(54) METHOD FOR SPIN COATING A HIGH VISCOSITY LIQUID ON A WAFER

(75) Inventors: Bao-Ru Young, I-Lan; Kun-I Lee, San-Chung; Der-Fang Huang, Hsin-Chu, all of (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/756,026

(22) Filed: Jan. 5, 2001

(51) Int. Cl.[7] .............................................. H01L 21/31
(52) U.S. Cl. ...................................................... 438/782
(58) Field of Search ................................. 438/758, 780, 438/782; 427/240; 257/642

(56) References Cited

U.S. PATENT DOCUMENTS 5,238,878 A * 8/1993 Shinohara .................... 427/240
5,780,105 A * 7/1998 Wang ........................... 438/782

* cited by examiner

Primary Examiner—Michael J. Sherry
Assistant Examiner—Lisa Kilday
(74) Attorney, Agent, or Firm—Randy W. Tung

(57) ABSTRACT

A method for spin-coating a high viscosity liquid on a wafer surface capable of producing an improved uniformity in the coating thickness and a reduced material usage is disclosed. In the method, a liquid that has a high viscosity of at least 1000 cp is first provided. A wafer is then rotated to a speed of less than 300 rpm while simultaneously, a first volume of a high viscosity liquid is dispensed onto the wafer surface forming a cup-shaped pattern. The spinning of the wafer is then stopped and a second volume of the high viscosity liquid is dispensed into a cavity formed in the cup-shaped pattern to substantially fill the cavity. The wafer is then rotated again to a high rotational speed of at least 3000 rpm such that liquid in the cup-shaped pattern spreads out to substantially cover an entire surface of the wafer resulting in improved coating uniformity.

20 Claims, 2 Drawing Sheets

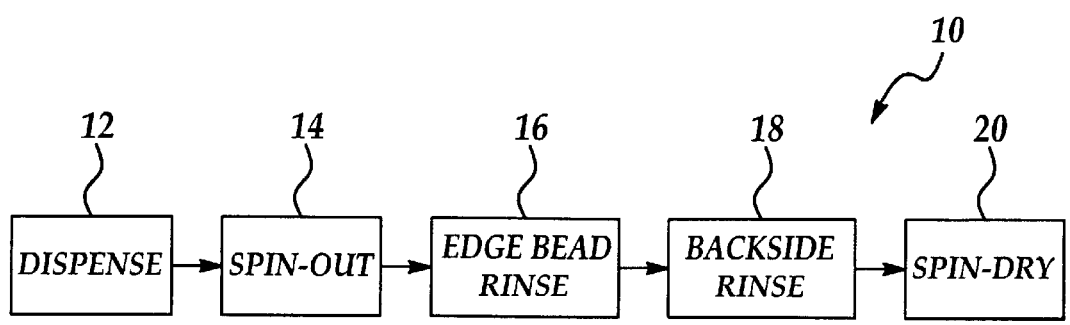
*Figure 1*
*Prior Art*
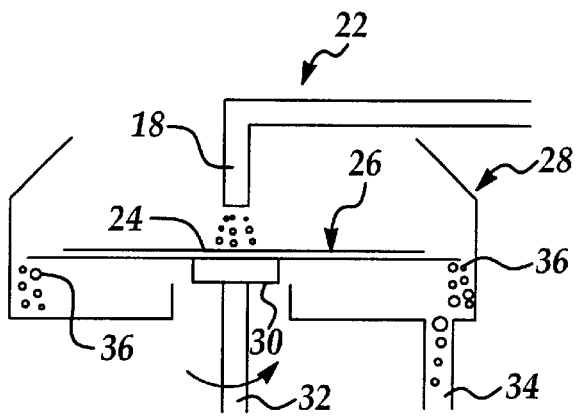
*Figure 2*
*Prior Art*
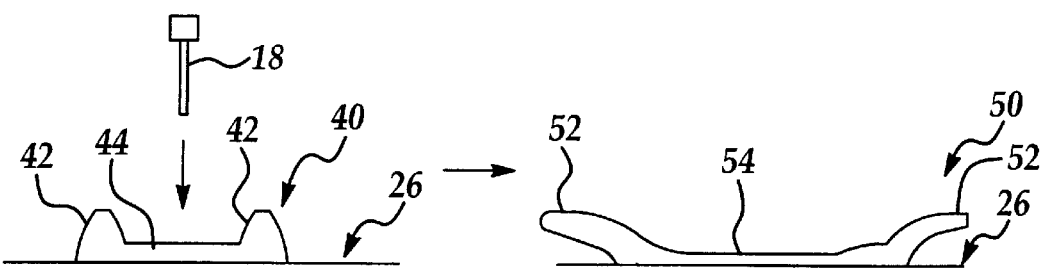
*Figure 3A*
*Prior Art*
*Figure 3B*
*Prior Art*

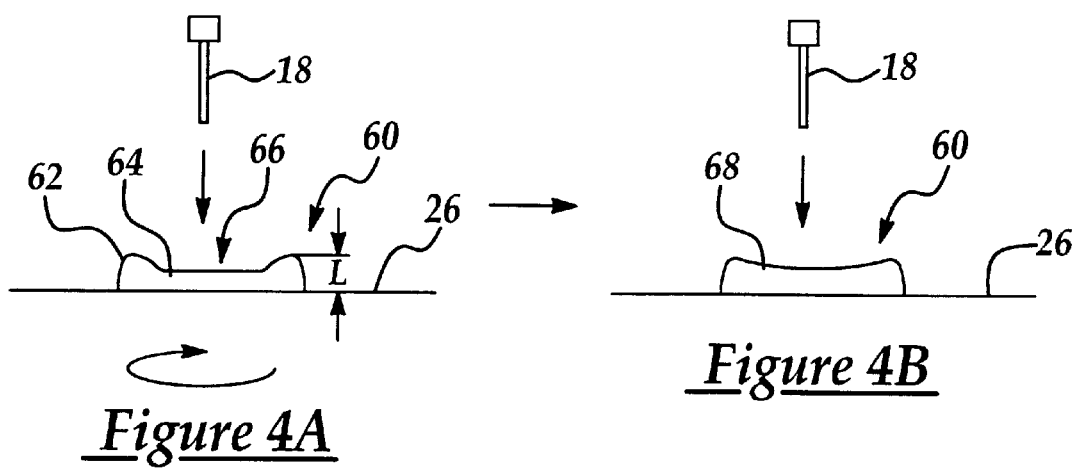
*Figure 4A*
*Figure 4B*
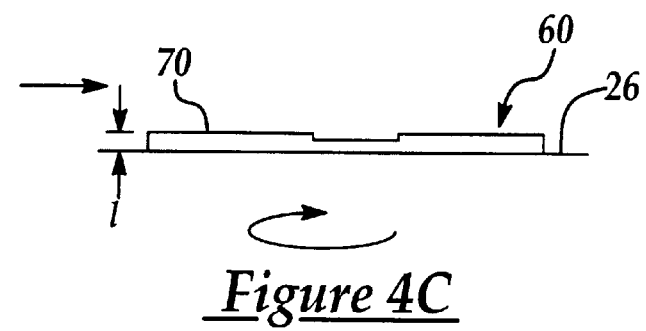
*Figure 4C*
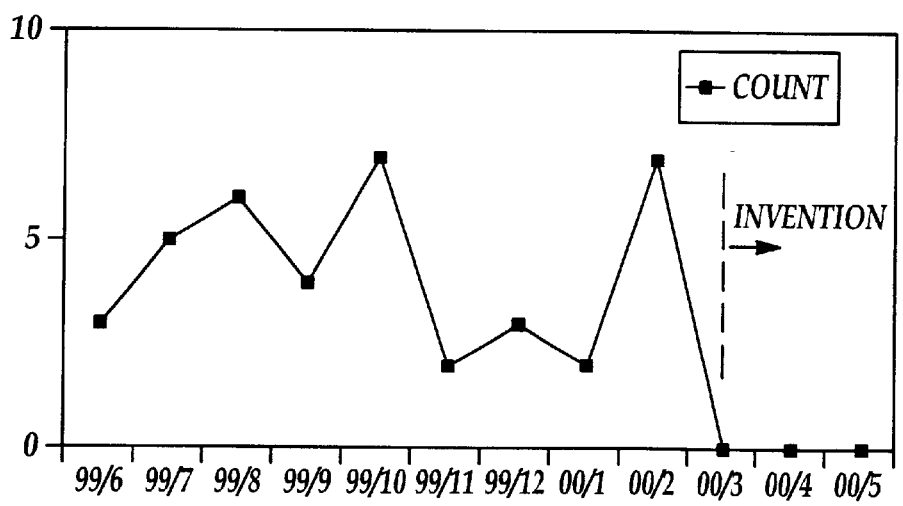
*Figure 5*

METHOD FOR SPIN COATING A HIGH VISCOSITY LIQUID ON A WAFER

FIELD OF THE INVENTION

The present invention generally relates to a method for coating a high viscosity liquid and more particularly, relates to a method for spin coating a high viscosity liquid on a semiconductor wafer by a dual-step process for achieving reduced material usage and improved coating uniformity.

BACKGROUND OF THE INVENTION

In the manufacturing processes for integrated circuits, a lithography process is frequently used for reproducing circuits and structures on a semiconductor substrate. As a first step in a lithography process, a photoresist layer is first coated onto a semiconductor substrate such that an image can be projected and developed on the substrate. The photoresist material is a liquid that is coated in a very thin layer on top of the semiconductor substrate. In a conventional process for applying a photoresist coating material to a semiconductor substrate, a spin coating apparatus is normally used. The spin coating apparatus is a sealed chamber constructed by an upper compartment, a lower compartment and a circular-shaped, rotating platform that has a diameter slightly smaller than the diameter of a semiconductor substrate. The rotating platform is a vacuum chuck since vacuum is applied to the platform for holding the semiconductor substrate securely during a spin coating process. The rotating platform is positioned in the coating machine such that a semiconductor substrate may be placed on top horizontally. During the coating process, the bottom or the uncoated surface of a semiconductor substrate contacts the rotating platform. A suitable vacuum is then applied to the bottom surface of the substrate such that it stays securely on the vacuum chuck even at high rotational speed. The rotating motion of the vacuum chuck is achieved by a shaft which is connected to the vacuum chuck and powered by a motor.

In a typical photoresist coating process, a desirable amount of a liquid photoresist material is first applied to a top surface of the semiconductor substrate from a liquid dispenser that is mounted on a track while the substrate is rotated at a low speed on the vacuum chuck. The photoresist liquid spread radially outward from the center of the semiconductor substrate where it is applied towards the edge of the semiconductor substrate until the entire top surface of the substrate is covered with a thin layer. Excess photoresist liquid spun off the rotating wafer during the photoresist coating process. The rotational speed of the vacuum chuck and the amount of the photoresist liquid applied at the center of the semiconductor substrate can be determined and adjusted prior to and during an application process such that a predetermined, desirable thickness of the photoresist is obtained. The rotational speed of the vacuum chuck is normally increased at the end of the application process to ensure that the entire surface of the substrate is evenly coated with the photoresist material.

A typical process flow chart illustrating a spin coating process 10 is shown in FIG. 1. In a conventional deposition process 10, a liquid material is first dispensed in step 12 by depositing a predetermined amount of liquid at or near the center of the wafer. The amount of the liquid can be suitably controlled by adjusting the flow rate through a dispensing nozzle from which the liquid is dispensed. The flow rate can, in turn, be controlled by a pressure existing in a liquid reservoir tank.

The wafer turns on a wafer pedestal at a rotational speed between 2000 and 3000 RPM when the liquid material is dispensed at the center of the wafer. The liquid material is then spun-out in step 14 by centrifugal forces from the center toward the edge of the wafer uniformly over the entire wafer surface. After all the liquid material is spun-out and the edge of the wafer is fully covered, the solvent contained in liquid has at least partially vaporized and form a solid coating on the wafer surface. After the spin-out step 14 is completed, an edge bead rinse process of step 16 is carried out at the edge of the wafer surface, i.e. an area of approximately 2–3 mm from the edge of the wafer, to wash away material deposited at such area. At this stage of the process, the material has mostly solidified and thus the edge bead rinse process is not always effective. After the edge bead rinse step 16, the backside of the wafer is rinsed by a different jet of cleaning solvent to wash away any material deposited at undesirable locations. This is shown as step 18 in FIG. 1. The wafer is then spun-dry in step 20 to complete the coating process.

A typical apparatus 22 for coating photoresist on a semiconductor substrate is shown in FIG. 2. The apparatus 22 consists of a drain cup 28 and a rotating platform 30, i.e. a vacuum chuck, positioned at the center of the drain cup for supporting a semiconductor wafer 26 on a top surface 24 of the vacuum chuck 20. The vacuum chuck can be rotated by a shaft 32 which is connected to an electric motor (not shown). The drain cup 28 is provided with a spent photoresist drain pipe 34. The spent photoresist drain pipe 34 is used to drain away photoresist liquid that spun off the substrate during a coating operation.

In the operation of the conventional spin coater 22 of FIG. 2, the rotating platform 30 is first loaded with a semiconductor wafer 26 on top. A liquid dispenser 18 then approaches the center of the wafer 26 and applies a predetermined amount of a liquid photoresist material to the center of the substrate. The rotating platform 30 then spins to spread out the photoresist material to evenly cover the top surface of the wafer 26. Extra photoresist material 36 is thrown off the substrate surface and drained away by the drain pipe 34.

In the conventional spin-coating process of FIG. 1 utilizing the apparatus of FIG. 2, the process results in a significant waste of the coating material and furthermore, a non-uniform coating when a highly viscous liquid is being coated. By highly viscous, it is meant that any liquid material that has a viscosity of higher than 1000 cp.

A typical non-uniformity measured on a coated film is shown in FIGS. 3A and 3B, while a typical spin-coating process recipe for a high viscosity photoresist material is shown in Table 1.

TABLE 1

| Step # | Time (sec.) | Speed (rpm) | Dispense |
|---|---|---|---|
| 1 | 6 | 0 | YES |
| 2 | 12 | 200 | YES |
| 3 | 7 | 600 | YES |
| 4 | 4 | 800 | YES |
| 5 | 10 | 1000 | NO |
| 6 | 23 | 3000+ | NO |

In the conventional spin-coating process shown in Table 1 and FIGS. 3A and 3B, droplets of a photoresist material that has a high viscosity such as 4000 cp are first deposited onto the top surface of wafer 26. The droplets of the photoresist material form a cup-shaped coating layer 40 when the droplets are dispensed by the liquid dispenser 18. As seen in Table 1, steps 1, 2, 3 and 4, the photoresist liquid droplets are dispensed onto the top surface of the wafer 26.

Except for step 1 where the rotational speed is 0 rpm, the rotational speed of the wafer platform is increased, or ramped up during steps 2–4 from 0 rpm to 800 rpm, while the photoresist droplets are dispensed onto the wafer surface. The total dispense time for the liquid droplets is about 29 sec. during steps 1–4.

Due to the high rotational speed of the wafer when the liquid is dispensed, a pronounced cup-shaped formation of the coating layer 40 is produced. An edge hump 42 formed in the coating layer 40 is significantly higher than the center portion 44. For instance, the height of the edge hump 42 may be at least 10 $\mu$m, while the height of the center portion 44 is only about 3 $\mu$m. The large discrepancy between the thicknesses of the coating layer 40 results in a non-uniform coating layer 50 shown in FIG. 3B after layer 40 is spun out, as shown in steps 5 and 6 of Table 1. The edge hump 42 remains as edge hump 52, even though at a smaller height. The center portion 54 became significantly thinner than the original center portion 44 prior to the spinning process, i.e. On that is conducted initially at 1000 rpm and then ramped up to 3000 rpm or higher. For instance, the final spin-out speed may be between about 3000 rpm and about 5000 rpm. It should be noted that the initial spin-out is carried out for about 10 sec. at 1000 rpm.

FIG. 3B illustrates the non-uniformity problem resulted from the conventional spin-coating of high viscosity liquid coating material, such as a high viscosity photoresist liquid. The non-uniformity can not be improved by merely increasing the dispense volume of the liquid. Moreover, the high cost of the liquid coating material further prohibits any waste of the material during a spin coating process.

The conventional single-step spin-coating process is therefore inadequate and frequently results in a non-uniform coating of the high viscosity liquid material. The non-uniformity is partially caused by a large difference in the surface tension of the coating material and of the wafer. It was also observed that the degree of non-uniformity becomes worse when the acceleration time (for instance, 10 sec. shown in step 5) required to reach the maximum spin speed.

It is therefore an object of the present invention to provide a method for spin-coating a high viscosity liquid on a wafer surface that does not have the drawbacks or shortcomings of the conventional spin-coating methods.

It is another object of the present invention to provide a method for spin-coating a high viscosity liquid on a wafer surface that is capable of producing improved coating uniformity across the wafer surface.

It is a further object of the present invention to provide a method for spin-coating a high viscosity liquid on a wafer surface that does not waste a large volume of the coating material.

It is another further object of the present invention to provide a method for spin-coating a high viscosity liquid on a wafer surface that can be used to coat liquids with a viscosity of at least 1000 cp.

It is still another object of the present invention to provide a method for spin-coating a high viscosity liquid on a wafer surface wherein the liquid may be a photoresist material, a spin-on-glass material or a low-k dielectric material.

It is yet another object of the present invention to provide a method for spin-coating a high viscosity liquid on a wafer surface by a dual-step coating process.

It is still another further object of the present invention to provide a method for spin-coating a high viscosity liquid on a wafer surface by first coating the wafer while the wafer is spinning, and then coating the wafer while it is in a stationary state.

It is yet another further object of the present invention to provide a method for spin-coating a high viscosity liquid on a wafer surface by a dual-step coating process wherein a wafer is first coated while spinning at a speed of between 200 rpm and 300 rpm, and then coating the wafer while it is stationary.

SUMMARY OF THE INVENTION

The present invention discloses a method for spin-coating a high viscosity liquid on a wafer surface that is capable of producing improved coating uniformity and reduced material usage.

In a preferred embodiment, a method for spin-coating a high viscosity liquid on a wafer surface can be carried out by the operating steps of first providing a liquid that has a viscosity of at least 1000 cp; rotating a wafer that has a top surface to be coated in a first rotating step to a speed of less than 300 rpm while simultaneously dispensing in a first step the liquid onto the top surface of the wafer forming a cup-shaped pattern at a center portion of the wafer; stopping the rotation of the wafer; dispensing in a second step the liquid onto the top surface of the wafer to sufficiently fill a cavity in the cup-shaped pattern; and then rotating the wafer in a second rotating step to a speed of at least 3000 rpm such that the liquid in the cup-shaped pattern spreads out to substantially cover an entire top surface of the wafer.

The method for spin coating a high viscosity liquid on a wafer surface may further include the step of rotating the wafer in the first rotating step preferably to a speed between about 100 rpm and about 280 rpm, and more preferably to a speed between about 200 rpm and about 250 rpm. The method may further include the step of forming the cup-shaped pattern of the liquid to a total thickness of at least 10 $\mu$m, or the step of providing the liquid that has a viscosity preferably of at least 3000 cp. The method may further include the step of providing the liquid in a material selected from the group consisting of a photoresist liquid, a spin-on-glass liquid and a low-k dielectric liquid. The method may further include the step of dispensing in the second step the liquid in an amount that is less than 50% of the total liquid dispensed in the first and second step.

The method for spin-coating a high viscosity liquid on a wafer surface may further include the step of rotating the wafer in the second rotating step until the cup-shaped pattern of liquid spreads out to a film that has a thickness of between about 3 $\mu$m and about 10 $\mu$m, and more preferably between about 4 $\mu$m and about 6 $\mu$m. The method may further include the step of ramping up in the second rotation step the wafer to a speed of at least 3000 rpm within a time period of less than 5 sec., or preferably within a time period of less than 2 sec.

The present invention is further directed to a dual-step method for coating a high viscosity liquid on a wafer surface which can be carried out by the operating steps of first filling a liquid dispenser in a spin-coating apparatus with a liquid that has a viscosity of at least 1000 cp; providing a wafer that has an active surface to be coated; rotating the wafer to a first rotation speed of less than 300 rpm while simultaneously dispensing in a first dispensing step the liquid onto the active surface of the wafer forming a coating layer that has a concave cross-section; reducing the first rotational speed to 0 rpm; dispensing in a second dispensing step the liquid into a cavity formed by the concave cross-section and substantially filling the cavity; and rotating the wafer from the first rotational speed of 0 rpm to a second rotational speed of at least 3000 rpm within a time period of less than 5 sec. so that the liquid substantially covers the entire active surface of the wafer.

The dual-step method for coating a high viscosity liquid on a wafer surface may further include the step of rotating the wafer preferably to a first rotational speed of between about 100 rpm and about 280 rpm, and more preferably to a first rotational speed of between about 200 rpm and about 250 rpm. The method may further include the step of forming the coating layer that has a concave cross-section to a total thickness of at least 10 $\mu$m. The method may further include the step of rotating the wafer at the second rotational speed until the liquid spreads out to a film thickness of between about 3 $\mu$m and about 10 $\mu$m. The method may further include the step of providing the liquid that has a viscosity preferably of at least 3000 cp, while the liquid may be a photoresist liquid, a spin-on-glass liquid or a low-k dielectric liquid. The method may further include the step of dispensing in the second step the liquid in an amount that is less than 50% of the total liquid dispensed in the first and second steps. The method may further include the step of rotating the wafer at the second rotational speed until the liquid spreads out to a film thickness of between about 4 $\mu$m and about 6 $\mu$m.

BRIEF DESCRIPTION OF THE DRAWINGS

These and other objects, features and advantages of the present invention will become apparent from the following detailed description and the appended drawings in which:

FIG. 1 is a process flow chart for a conventional spin-coating process on a wafer.

FIG. 2 is a cross-sectional view of a conventional spin-coater utilized in spin-coating a liquid.

FIG. 3A is an enlarged, cross-sectional view of a cup-shaped coating layer formed on a wafer surface by the conventional spin-coating process.

FIG. 3B is the coating layer of FIG. 3A after spun-out at a rotational speed of 3000 rpm.

FIG. 4A is an enlarged, cross-sectional view of a coating layer formed by the present invention method while the wafer is rotating at a slower speed.

FIG. 4B is an enlarged, cross-sectional view of the present invention coating layer with the cavity filled by the liquid material while the wafer is stationary.

FIG. 4C is an enlarged, cross-sectional view of the present invention coating layer after spun-out to cover the entire wafer surface.

FIG. 5 is a graph illustrating the defect count prior to and after the implementation of the present invention novel method.

DETAILED DESCRIPTION OF THE PREFERRED EMBODIMENT

The present invention discloses a method for spin-coating a high viscosity liquid on a wafer surface by a dual-step coating process resulting in a significantly improved coating uniformity and reduced material usage. While the present invention novel method is particularly suited for coating a high viscosity photoresist material such as polyimide, it can be used for coating any other high viscosity material such as spin-on-glass or low-k dielectric.

The method can be carried out by first providing a liquid to be coated that has a high viscosity, then rotating a wafer to a speed of less than 300 rpm and simultaneously dispensing the liquid onto the top surface of the wafer forming a cup-shaped pattern. The spinning of the wafer is then stopped and a second amount of the liquid is dispensed into the cup-shaped pattern of the coating layer previously formed to fill a cavity in the pattern. The wafer is then spun again to a speed of at least 3000 rpm such that the liquid in the cup-shaped pattern spreads out to substantially cover the entire surface of the wafer.

The present invention utilizes a novel second coating step for the high viscosity liquid, i.e. while the wafer is held stationary such that a cavity in a cup-shaped coating layer can be filled with the liquid prior to the spun-out process for spreading the liquid over the entire wafer surface.

The present invention novel dual-step coating process not only reduces the required dispense volume of the liquid, thus achieving material savings, but also improves the coating uniformity over the entire wafer surface. The spun-out speed for the coating material is increased to the main speed in a time period that is shorter than that required in the conventional method, resulting in an improved coating uniformity of the high viscosity liquid material. It has been found that the dispense volume of the high viscosity photoresist material, such as a polyimide, can be reduced from 2.5 cc to 1.5 cc per wafer which leads to a significant cost saving.

TABLE 2

| Step # | Time (sec.) | Speed (rpm) | Dispense |
|--------|-------------|-------------|----------|
| 1 | 4 | 0 | YES |
| 2 | 4 | 220 | YES |
| 3 | 8 | 250 | YES |
| 4 | 6 | 0 | YES |
| 5 | 1 | 300 | NO |
| 6 | 1 | 800 | NO |
| 7 | 1 | 1000 | NO |
| 8 | 25 | 3000+ | NO |

Referring now to Table 2 and FIGS. 4A–4C, wherein a present invention novel method of dual-step spin-coating of a high viscosity photoresist material is illustrated. At the beginning of the dual-step coating process, as shown in FIG. 4A and steps 1, 2 and 3 in Table 2, the photoresist liquid is dispensed onto the wafer 26 from a liquid dispenser 18 forming a cup-shaped coating layer 60. The cup-shaped coating layer 60 is formed with an edge hump 62 which has a thickness significantly larger than the center portion 64 of the coating layer. The first coating step is conducted while the wafer is rotated at a low rotational speed, i.e. at less than 250 rpm, and preferably, at less than 300 rpm, as shown in steps 2 and 3 in Table 2. Step 1 illustrates a ramp-up step wherein the wafer is turned from 0 rpm to 220 rpm.

According to the present invention novel method, the rotation of the wafer is then stopped, as shown in step 4 of Table 2, wherein the rpm is 0. Additional high viscosity liquid is then applied into the cavity 66 formed in the cup-shaped coating layer 60 to substantially fill the cavity such that a leveled surface 68 on the coating layer is obtained. This is shown in step 4 which is conducted for a time period of 6 sec. in Table 2 while the high viscosity liquid is dispensed into the cavity 66.

After the cavity 66 in the coating layer 60 is filled with the additional high viscosity liquid material, the wafer 26 is spun to spread out the coating layer 60 resulting in a substantially uniform thickness and a substantially leveled top surface 70, as shown in FIG. 4C. The initial thickness "L" shown in FIG. 4A is at least 10 $\mu$m, or preferably at least 15 µm. After the spun-out step of the present invention method, the final uniform thickness "1" is about 5 µm, or a thickness in the range between about 3 µm and about 8 µm.

The present invention novel method therefore allows a more uniform coating layer to be formed of a high viscosity material on a wafer surface in a spin-coating apparatus. The total volume of the liquid material dispensed in forming the uniform thickness layer is reduced, i.e. from 2.5 cc of photoresist material to 1.5 cc for coating a single wafer.

FIG. 5 shows a graph illustrating poor coating counts on wafers coated with a high viscosity photoresist material, i.e. a polyimide, during a time period of approximately one year. It is noted that the present invention novel method was implemented at time 00/3 resulting in zero/poor coating counts in the last 3 measurements, i.e. a 700% reduction from the highest poor coating counts during the year.

Table 2 further shows that the present invention novel method spun-out process is executed differently than that in the conventional spin-coating technique. The high spun-out speed of 3000 rpm+(i.e. 3000 rpm~5000 rpm) is rapidly ramped up in a short time period of 3 sec. For instance, between steps 5 and 8, the rotational speed of the wafer for spreading out the coating layer is increased from 300 rpm to 3000 rpm in a short 3 sec. time duration. This was also determined as a factor in achieving the present invention desirable result of uniform coating thickness.

The present invention novel method for spin-coating a high viscosity liquid on a wafer surface has therefore been amply described in the above description and in the appended drawings of FIGS. 4A–4C and 5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for spin coating a high viscosity liquid on a wafer surface comprising the steps of:
   providing a liquid having a viscosity of at least 1000 cp;
   rotating a wafer having a top surface to be coated in a first rotating step to a speed of less than 300 rpm while simultaneously dispensing in a first step said liquid onto said top surface of the wafer forming a cup-shaped pattern at a center portion of said wafer;
   stopping the rotation of said wafer;
   dispensing in a second step said liquid onto said top surface of the wafer to sufficiently fill up a cavity in said cup-shaped pattern; and
   rotating said wafer in a second rotating step to a speed of at least 3000 rpm such that said liquid in said cup-shaped pattern spreads out to substantially cover an entire top surface of said wafer.

2. A method for spin coating a high viscosity liquid on a wafer surface according to claim 1 further comprising the step of rotating said wafer in said first rotating step preferably to a speed between about 100 rpm and about 280 rpm.

3. A method for spin coating a high viscosity liquid on a wafer surface according to claim 1 further comprising the step of rotating said wafer in said first rotating step more preferably to a speed between about 200 rpm and about 250 rpm.

4. A method for spin coating a high viscosity liquid on a wafer surface according to claim 1 further comprising the step of forming said cup-shaped pattern of said liquid to a total thickness of at least 10 µm.

5. A method for spin coating a high viscosity liquid on a wafer surface according to claim 1 further comprising the step of providing said liquid having a viscosity preferably of at least 3000 cp.

6. A method for spin coating a high viscosity liquid on a wafer surface according to claim 1 further comprising the step of providing said liquid in a material selected from the group consisting of a photoresist liquid, a spin-on-glass liquid and a low-k dielectric liquid.

7. A method for spin coating a high viscosity liquid on a wafer surface according to claim 1 further comprising the step of dispensing in said second step said liquid in an amount that is less than 50% of the total liquid dispensed in said first and second step.

8. A method for spin coating a high viscosity liquid on a wafer surface according to claim 1 further comprising the step of rotating said wafer in said second rotation step until said cup-shaped pattern of liquid spreads out to a film having a thickness between about 3 µm and about 10 µm.

9. A method for spin coating a high viscosity liquid on a wafer surface according to claim 1 further comprising the step of rotating said wafer in said second rotation step until said cup-shaped pattern of liquid spreads out preferably to a film having a thickness between about 4 µm and about 6 µm.

10. A method for spin coating a high viscosity liquid on a wafer surface according to claim 1 further comprising the step of ramping-up in said second rotation step said wafer to a speed of at least 3000 rpm within a time period of less than 5 sec.

11. A method for spin coating a high viscosity liquid on a wafer surface according to claim 1 further comprising the step of ramping-up in said second rotation step said wafer to a speed of at least 3000 rpm within a time period preferably of less than 2 sec.

12. A dual-step method for coating a high viscosity liquid on a wafer surface comprising the steps of:
   filling a liquid dispenser in a spin coating apparatus with a liquid having a viscosity of at lest 1000 cp;
   providing a wafer having an active surface to be coated;
   rotating said wafer to a first rotational speed of less than 300 rpm while simultaneously dispensing in a first dispensing step said liquid onto said active surface of the wafer forming a coating layer having a concave cross-section;
   reducing said first rotational speed to 0 rpm;
   dispensing a second dispensing step said liquid into a cavity formed by said concave cross-section and substantially filling said cavity; and
   rotating said wafer from said first rotational speed of 0 rpm to a second rotational speed of at least 3000 rpm within a time period of less than 5 sec. so that said liquid substantially covers the entire active surface of the wafer.

13. A dual-step method for coating a high viscosity liquid on a wafer surface according to claim 12 further comprising the step of rotating said wafer preferably to a first rotational speed between about 100 rpm and about 280 rpm.

14. A dual-step method for coating a high viscosity liquid on a wafer surface according to claim 12 further comprising the step of rotating said wafer more preferably to a first rotational speed between about 200 rpm and about 250 rpm.

15. A dual-step method for coating a high viscosity liquid on a wafer surface according to claim 12 further comprising the step of forming said coating layer having a concave cross-section to a total thickness of at least 10 μm.

16. A dual-step method for coating a high viscosity liquid on a wafer surface according to claim 12 further comprising the step of rotating said wafer at said second rotational speed until said liquid spreads out to a film thickness of between about 3 μm and about 10 μm.

17. A dual-step method for coating a high viscosity liquid on a wafer surface according to claim 12 further comprising the step of providing said liquid having a viscosity preferably of at least 3000 cp.

18. A dual-step method for coating a high viscosity liquid on a wafer surface according to claim 12 further comprising the step of providing said liquid in a material selected f rom the group consisting of a photoresist liquid, a spin-on-glass liquid and a low-k dielectric liquid.

19. A dual-step method for coating a high viscosity liquid on a wafer surface according to claim 12 further comprising the step of dispensing in said second step said liquid in an amount that is less than 50% of the total liquid dispensed in said first and second steps.

20. A dual-step method for coating a high viscosity liquid on a wafer surface according to claim 12 further comprising the step of rotating said wafer at said second rotational speed until said liquid spreads out to a film thickness of between about 4 μm and about 6 μm.

\* \* \* \* \*